US006722275B2

(12) United States Patent
Coleman et al.

(10) Patent No.: US 6,722,275 B2
(45) Date of Patent: Apr. 20, 2004

(54) RESERVOIR STENCIL WITH RELIEF AREAS AND METHOD OF USING

(75) Inventors: William E. Coleman, Colorado Springs, CO (US); Stanley J. Allen, Peyton, CO (US); Michele Gaddy, Saint Louis, MO (US)

(73) Assignee: Photo Stencil, LLC, Colorado Springs, CO (US)

( * ) Notice: Subject to any disclaimer, the term of this patent is extended or adjusted under 35 U.S.C. 154(b) by 67 days.

(21) Appl. No.: 10/075,955

(22) Filed: Feb. 14, 2002

(65) Prior Publication Data

US 2003/0061948 A1 Apr. 3, 2003

Related U.S. Application Data

(60) Provisional application No. 60/325,587, filed on Sep. 28, 2001.

(51) Int. Cl.[7] .............................. B41N 1/24; B41M 1/12
(52) U.S. Cl. ................... 101/128.4; 101/127; 101/129; 427/96
(58) Field of Search ................ 101/127, 123, 101/124, 126, 128, 128.21, 128.4, 129; 118/213, 406; 427/96, 97, 282

(56) References Cited

U.S. PATENT DOCUMENTS

| 4,584,964 | A | 4/1986 | Engel ........................ 118/697 |
| 5,129,573 | A | 7/1992 | Duffey ..................... 228/180.1 |
| 5,627,108 | A | 5/1997 | Alibocus et al. ............ 228/175 |
| 5,740,730 | A | 4/1998 | Thompson, Sr. ............ 101/127 |
| 5,873,512 | A | 2/1999 | Bielick et al. .............. 228/216 |
| 5,947,021 | A | 9/1999 | Coleman et al. ............ 101/120 |
| 6,096,131 | A | 8/2000 | Hewett ....................... 118/504 |
| 6,158,338 | A | 12/2000 | MacRaild et al. .......... 101/123 |
| 6,171,399 | B1 | 1/2001 | Kaiser et al. ............... 118/406 |
| 6,183,839 | B1 | 2/2001 | Bourrieres .................. 428/131 |
| 6,253,675 | B1 | 7/2001 | Mayer ..................... 101/127.1 |

OTHER PUBLICATIONS

English language translation of JP 03-092390, "Screen Printing Plate and Preparation Thereof"; Takahashi et al.*
Karen Moore-Watts, DEK Printing Machines Ltd., "Pump-Printing to be Highlighted at the Assembly Show," Press Release, Sep. 24, 2001, printed from http://www.dek.com.
DEK Printing Machines Ltd., Product Catalogue, Screens & Stencils: PumpPrint Stencils, printed from http://www.dek.com on Oct. 29, 2001.
Loctite UK Ltd., Technology Pamphlet, "Varidot: Surface Mount Adhesive (SMA) Printing Process," printed from http://www.loctite-europe.com on Oct. 30, 2001.
Rich Lieske and Ken Quigley, "Screen Printing Bottom Side Chip Attach Adhesive," Proceedings of NEPCON West 1997: Alternative Screen Printing Processes, pp. 167–177.
Mark Whitmore, Colin MacKay & Alan Hobby, "Plastic Stencils For Bottomside Chip Attach," Proceedings of NEPCON West 1997: Alternative Screen Printing Processes, pp. 178–191.

* cited by examiner

*Primary Examiner*—Leslie J. Evanisko
(74) *Attorney, Agent, or Firm*—Choate, Hall & Stewart

(57) ABSTRACT

A stencil comprising two or more layers is disclosed for applying surface mount materials onto printed circuit boards, flexible circuits, wafers or other substrates. The stencil can accommodate preexisting surface mount components and materials. The stencil utilizes material reservoirs, relief areas and delivery apertures and can be used for depositing surface mount materials such as adhesives, conductive glues, solder paste and solder balls.

28 Claims, 11 Drawing Sheets

RESERVOIR STENCIL WITH RELIEF AREAS AND METHOD OF USING

RELATED APPLICATIONS

The present application claims priority to U.S. Provisional Application No. 60/325,587 filed Sep. 28, 2001.

FIELD OF THE INVENTION

This invention is directed to the field of surface mount technology and more particularly to an apparatus and method for applying adhesives and/or solder to printed circuit boards, flexible circuits, wafers and other substrates.

BACKGROUND OF THE INVENTION

The surface mount technology (SMT) assembly industry requires the application of surface mount materials such as adhesives and solder onto printed circuit boards (PCBs), flexible circuits and wafers. Components are glued in place on the PCB before normally going through a wave solder process to solder the components to the PCB. One of the methods of depositing glue onto the PCB is with a glue dispensing machine. This is a sequential process where glue is dispensed through a fine orifice point by point under control of an X-Y positioning machine. (See, e.g. U.S. Pat. No. 4,584,964 to Engel). Glue and solder printing can also be done by stencil printing, which is a parallel process. Material is applied to a stencil and then forced onto a substrate through openings in the stencil. (See, e.g. U.S. Pat. No. 5,627,108 to Alibocus et al.; U.S. Pat. No. 5,740,730 to Thompson; and U.S. Pat. No. 5,873,512 to Beilock et al.).

These current techniques generally lack the flexibility to handle the variety of shapes and heights of glue and solder paste deposits which may be needed due to the diversity of components that are often used. For example, a 0603 chip component may require a glue deposit 13 mils wide by 33 mils long by 8 mils high. At the same time, a plastic leaded chip carrier (PLCC) may require a glue deposit 60 mils wide by 120 mils long by 30 mils high. In addition, current stencil printing techniques are generally ill-suited to handle preexisting components that may be as much as 50 mils high.

There is a further requirement where it is desirable to print glue on a PCB that already has clinched connector leads protruding through the PCB. In this case, the required vertical clearance for preexisting board components alongside the adhesive deposition sites poses the manufacturing dilemma of producing controllable-volume, micro-fine apertures in a substrate thick enough to clear the preexisting components.

It is also necessary in the SMT industry to deliver solder balls in a ball grid array (BGA) to a substrate, such as a BGA package or a silicon wafer with active circuits. The substrate has pads that need to have flux placed on their surface. BGA balls are placed into the flux on the pads through the use of a stencil. The tacky flux holds the balls onto the substrate. During the solder reflow process, the solder balls melt and become permanently attached to the substrate. It is desirable to bring the ball drop stencil in contact with the substrate and drop the balls into the flux deposits over the pads on the substrate. However, it is also desirable to keep the flux away from the bottom side of the stencil. Current techniques include a structure with a chemical etch relief on the bottom side of the stencil and a small hole etched all the way through the stencil. This is a very difficult process to control.

There is therefore a need in the SMT industry to provide a cost-effective, flexible and easily-controllable means for applying viscous materials, such as adhesives, conductive glue, solder paste, and solder balls, onto PCBs, flexible circuits, wafers and other substrates.

SUMMARY OF THE INVENTION

The present invention discloses an apparatus and method for depositing adhesives, conductive glues, solder paste, solder balls and other viscous surface mount materials onto printed circuit boards (PCBs), flexible circuits, wafers and other substrates. The invention can accommodate preexisting surface mount components and materials. The invention comprises a stencil with two or more layers and utilizes material reservoirs, relief areas and delivery apertures.

In one aspect of the invention, a stencil for applying surface mount materials is disclosed which comprises at least two layers. The layers comprise at least one reservoir pocket and at least one delivery aperture and may further comprise at least one relief area. The delivery aperture delivers surface mount materials from the reservoir pocket to a surface. The relief area provides clearance for preexisting components on the surface so as to allow the delivery aperture to contact the surface. The reservoir pockets, relief areas and delivery apertures can be combined within any number of layers. In a preferred embodiment, the number of layers used is two or three, and the layers are made of metal and manufactured by the processes of chemical etch, laser cut, or electroforming. The layers can be aligned through the use of registration pins and etched registration holes and attached to one another by means of an aqueous dry-mount solder mask laminate.

In another aspect, a stencil for applying surface mount materials is disclosed which comprises: an upper reservoir layer with reservoir pockets; a middle separation layer with relief areas and reservoir through pockets; and a lower contacting layer with delivery apertures and relief openings. The delivery apertures deliver measured surface mount materials from the reservoir pockets to the surface by way of the reservoir through pockets in the middle separation layer which connect to the reservoir pockets in the upper reservoir layer. The lower contacting layer has relief openings which are connected to the relief areas in the middle separation layer.

In another aspect, a stencil for applying solder balls in a desired pattern onto a substrate is disclosed which comprises: an upper layer with at least one ball drop reservoir aperture; and a lower contacting layer with at least one relief delivery aperture to provide clearance for flux on pad sites on the substrate.

In yet another aspect, a method for depositing surface mount materials onto a surface is disclosed which comprises the steps of: matching relief areas in the stencil with preexisting surface mount components on a surface; affixing the stencil to the surface; applying surface mount materials to the stencil such that the surface mount materials fill reservoir pockets in the stencil; and depositing surface mount materials onto the surface through delivery apertures on the stencil, wherein the delivery apertures draw the surface mount material from the reservoir pockets.

BRIEF DESCRIPTION OF THE DRAWING

The invention is described with reference to the several figures of the drawing, in which.

DETAILED DESCRIPTION OF THE INVENTION

Figure 1:
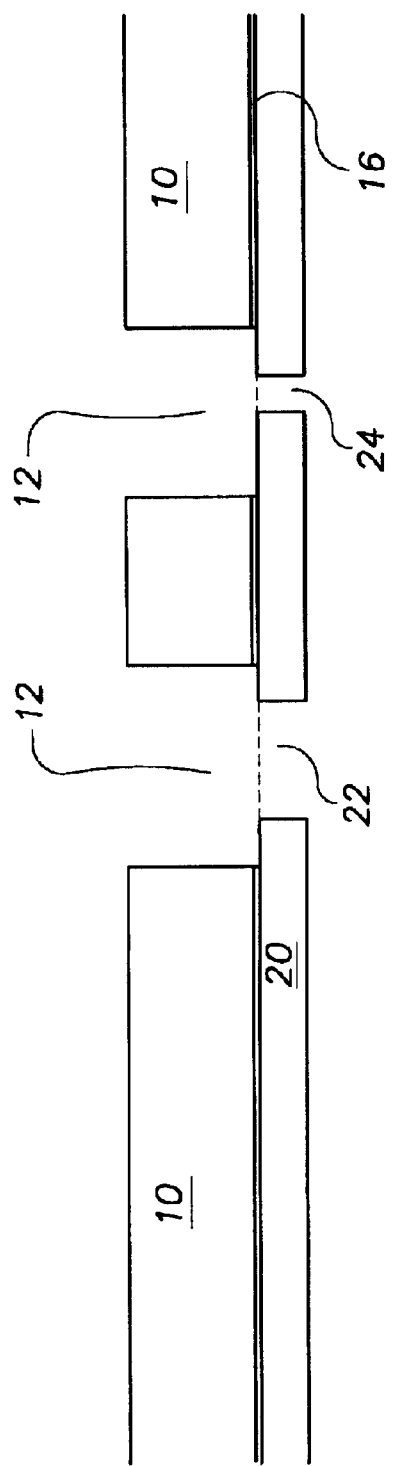
FIG. 1 is a cross-sectional view of one embodiment of the invention showing a stencil with upper reservoir layer and lower aperture layer.

Referring now to the figures of the drawing, the figures constitute a part of this specification and illustrate exemplary embodiments to the invention. It is to be understood that in some instances various aspects of the invention may be shown exaggerated or enlarged to facilitate an understanding of the invention.

FIG. 1 is a cross-sectional view of the invention featuring a stencil comprising two layers (or foils). An upper reservoir layer 10 contains reservoirs 12 for adhesive delivery. A lower aperture layer 20 contains delivery apertures of varying sizes (large aperture 22 and small aperture 24) for adhesive contact onto the PCB. The layers are attached to one another with a dry-mount solder mask laminate 16. The solder mask provides permanent adhesion between layers, and once heat-cured, an impermeable solvent barrier at aperture or relief openings.

In a preferred embodiment, the layers are made of metal such as Alloy 42, stainless steel or electroformed nickel. Metal stencils offer a number of advantages over stencils made of other materials, such as plastic. Plastic stencils often suffer a build up of electrostatic charge during the printing process which must be somehow dispersed, for example, via the use of ionized air. A metal stencil does not build up such an electrostatic charge. It also easier to manufacture various aperture shapes and sizes in metal stencils as compared with plastic stencils.

The sandwiched layers are fed through a hot-roll laminator to pressure- and heat-activate the adhesive quality of the solder mask laminate 16. The treated board is then fed through a developer to remove excess mask, and form contiguous sidewalls between layers. The treated and developed board is cured with heat to harden the solder mask laminate into a solvent-resistant resin.

The stencil allows for a controlled deposition height and area of surface mount materials, such as a glue deposit. In one example, the upper reservoir layer 10 is 40 mils thick and the lower aperture layer 20 is 8 mils. The small aperture 24 for an 0603 chip component will typically have 6 to 8 mils high of glue deposited. The large aperture 22 will draw glue from the reservoir and deposit approximately 35 to 40 mils high of glue, enough for gluing a plastic leaded chip carrier in place.

Surface mount materials may be applied to the stencil in preparation for the delivery to the printed circuit board or other surface by any number of means. One way is through the use of a squeegee which is pushed over the surface of the stencil and which forces the viscous surface mount materials into the stencil openings. One example of such a squeegee and its method of use is disclosed in U.S. Pat. No. 5,947,021 to Coleman et al. entitled "Metal Squeegee Blade With a Titanium Nitride Coating," the teachings of which are hereby incorporated by reference.

Figure 2:
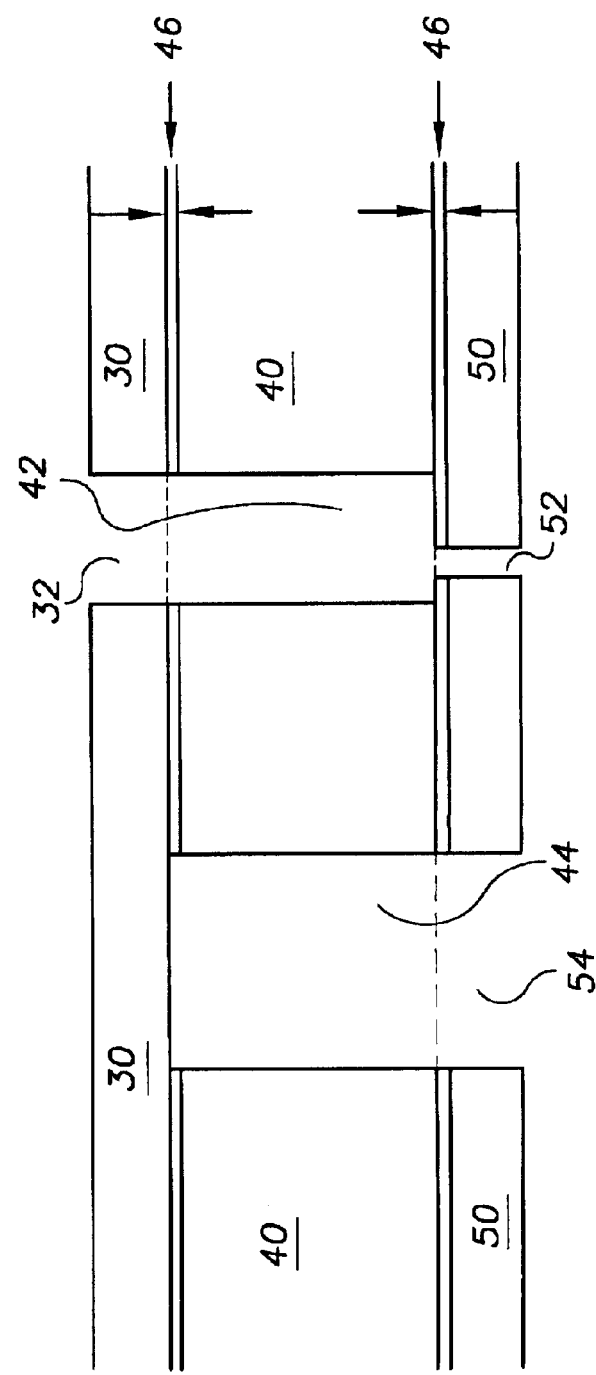
FIG. 2 is a cross-sectional view showing a stencil having three layers.

FIG. 2 is a cross-sectional view of the invention showing a stencil having three layers. The upper layer 30 features one or more reservoir pockets 32 to funnel adhesive from the reservoir fill surface to the lower layer. The upper layer 30 is manufactured typically with the chemical etch process although the laser cut and electroforming processes could also be used. In one embodiment, the upper layer 30 has a thickness of 8–10 mils and is typically made of Alloy 42 material although other thicknesses and materials, such as stainless steel and electroformed nickel, are also possible.

The middle layer 40 features one or more relief areas 44 corresponding to the preexisting clinched connector leads on the PCB and one or more reservoir through pockets 42 corresponding to the reservoir pockets 32 on the upper layer. The reservoir through pockets 42 provide additional reservoir space to store surface mount materials and connect the reservoir pockets on the upper layer with delivery apertures 52 on the lower layer 50. The middle layer 40 is manufactured typically with the chemical etching process although laser-cut and electroforming processes are also possible. In one embodiment, the middle layer 40 has a thickness of 40 mils and is typically made of Alloy 42 although other thicknesses and materials, such as stainless steel and electroformed nickel, are also possible.

The lower layer 50 features one or more relief openings 54, which connect to the relief areas 44 of the middle layer 40 and correspond to the preexisting clinched connector leads on the PCB, and one or more adhesive delivery apertures 52 which draw material from the reservoir pockets 32 by means of the reservoir through pockets 42 and control the volume of adhesive delivered to the PCB. The lower layer 50 is typically manufactured with a laser-cut process although chemical etch and electroforming processes are also possible. In one embodiment, the lower layer 50 has a thickness of 8–10 mils and is made of Alloy 42 although other thicknesses and materials, such as stainless steel and electroformed nickel, are also possible.

The three layers are produced with unevenly spaced etched registration pin holes along the glue borders. A 3 mil laminate layer 46 of dry-film solder mask is applied cold to both sides of the middle layer 40. The layers are assembled and aligned using registration pins and the etched registration holes. In one embodiment, the registration pins measure 150 mils high and 250 mils in diameter.

The sandwiched board of layers is fed through a hot-roll laminator to pressure- and heat-activate the adhesive quality of the solder mask. The treated board is then fed through a developer to remove excess mask and form contiguous sidewalls between the layers. The treated and developed board is heat-cured at 300 degrees Fahrenheit.

Figure 3:
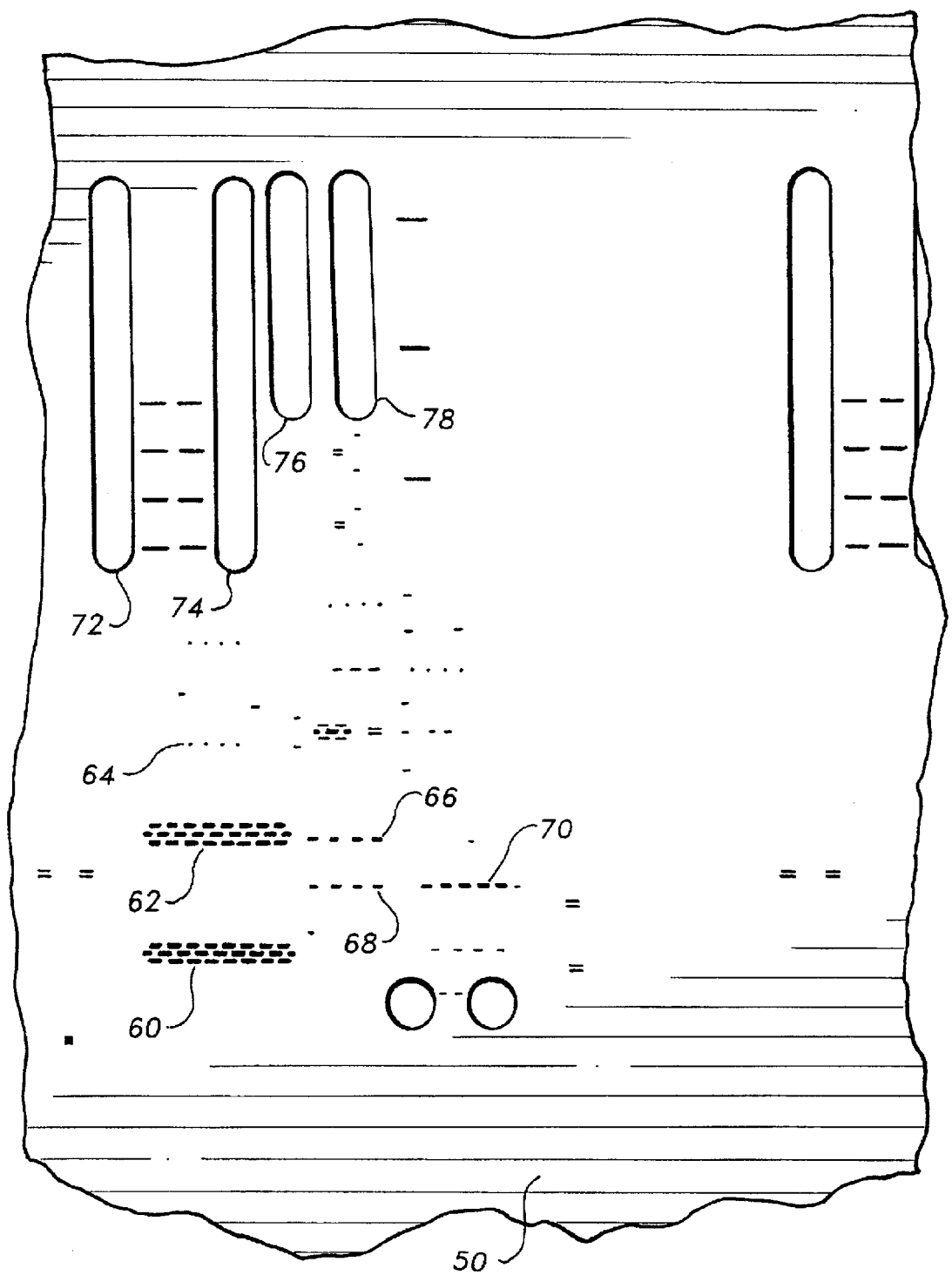
FIG. 3 is a plan view showing the relief areas and delivery apertures in a stencil (delivery aperture side)

FIG. 3 is a plan view showing a reservoir stencil with relief areas (delivery aperture side). The layer shown is a bottom layer 50 with a variety of sets of delivery apertures 62, 64, 66, 68, and 70 and relief areas 72, 74, 76, and 78. In one embodiment, the relief areas measure 48 mils tall.

Figure 4:
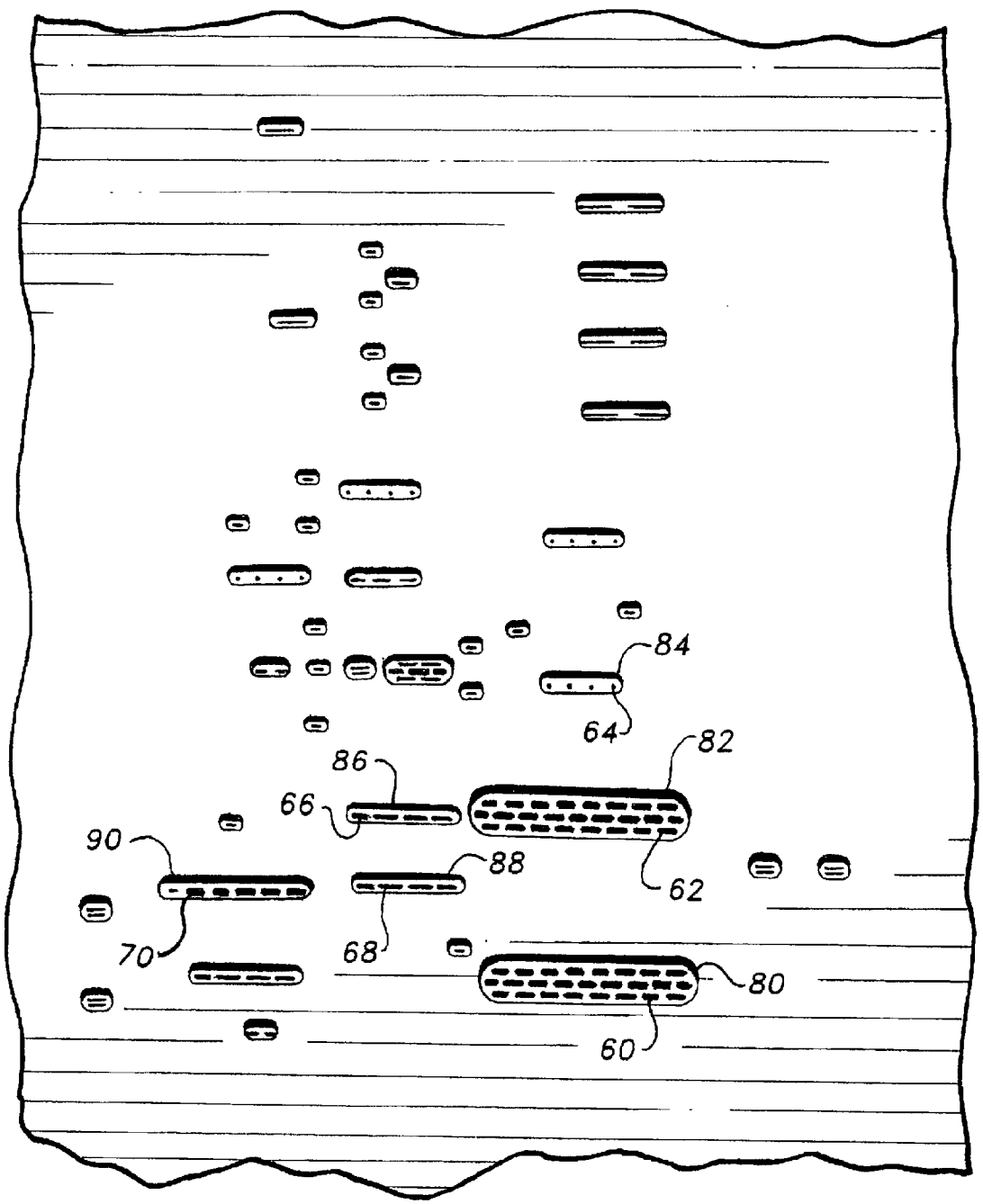
FIG. 4 is a plan view showing the reservoirs in a stencil (material application side)
Figure 5:
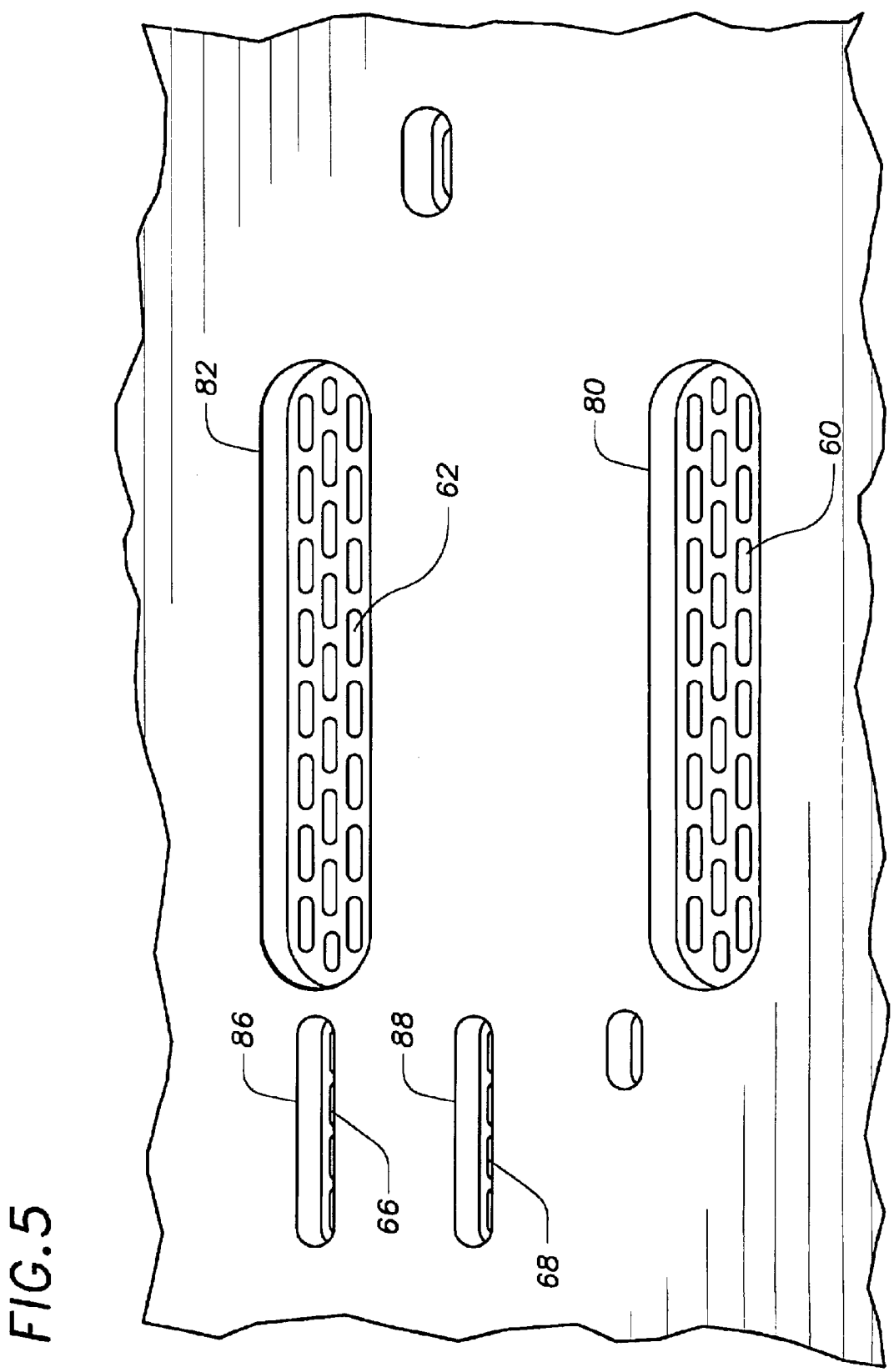
FIG. 5 is a magnified view looking through the reservoir layer to the delivery apertures (material application side)
Figure 6:
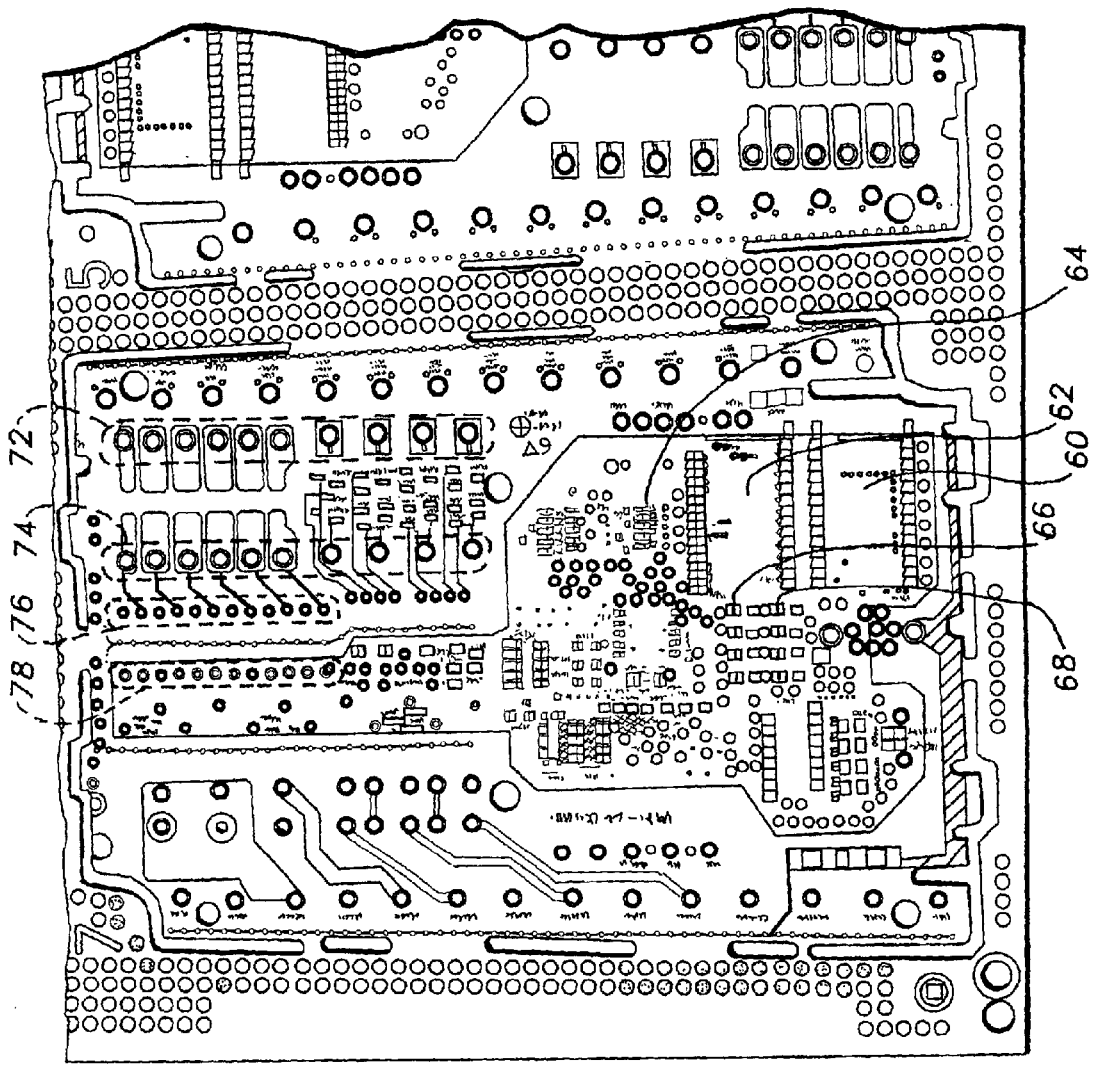
FIG. 6 is a plan view of a printed circuit board showing component and material sites corresponding to relief areas and delivery apertures.

FIG. 4 is a plan view showing a reservoir stencil with relief pockets (material application side). Shown are 50 mil tall reservoirs 80,82,84,86,88, and 90 connected to 8 mil tall delivery apertures 60,62, 64, 66, 68, and 70. FIG. 5 is a magnified view looking through a reservoir layer to the delivery apertures showing 50 mil tall reservoirs 80,82, 86, and 88 and joined side walls connected to delivery apertures 60,62,66, and 68. FIG. 6 is a plan view of a printed circuit board showing component sites corresponding to relief areas 72, 74, 76, and 78 and the application of surface mount materials corresponding to delivery apertures 60, 62, 64, 66, 68, and 70.

Figure 7:
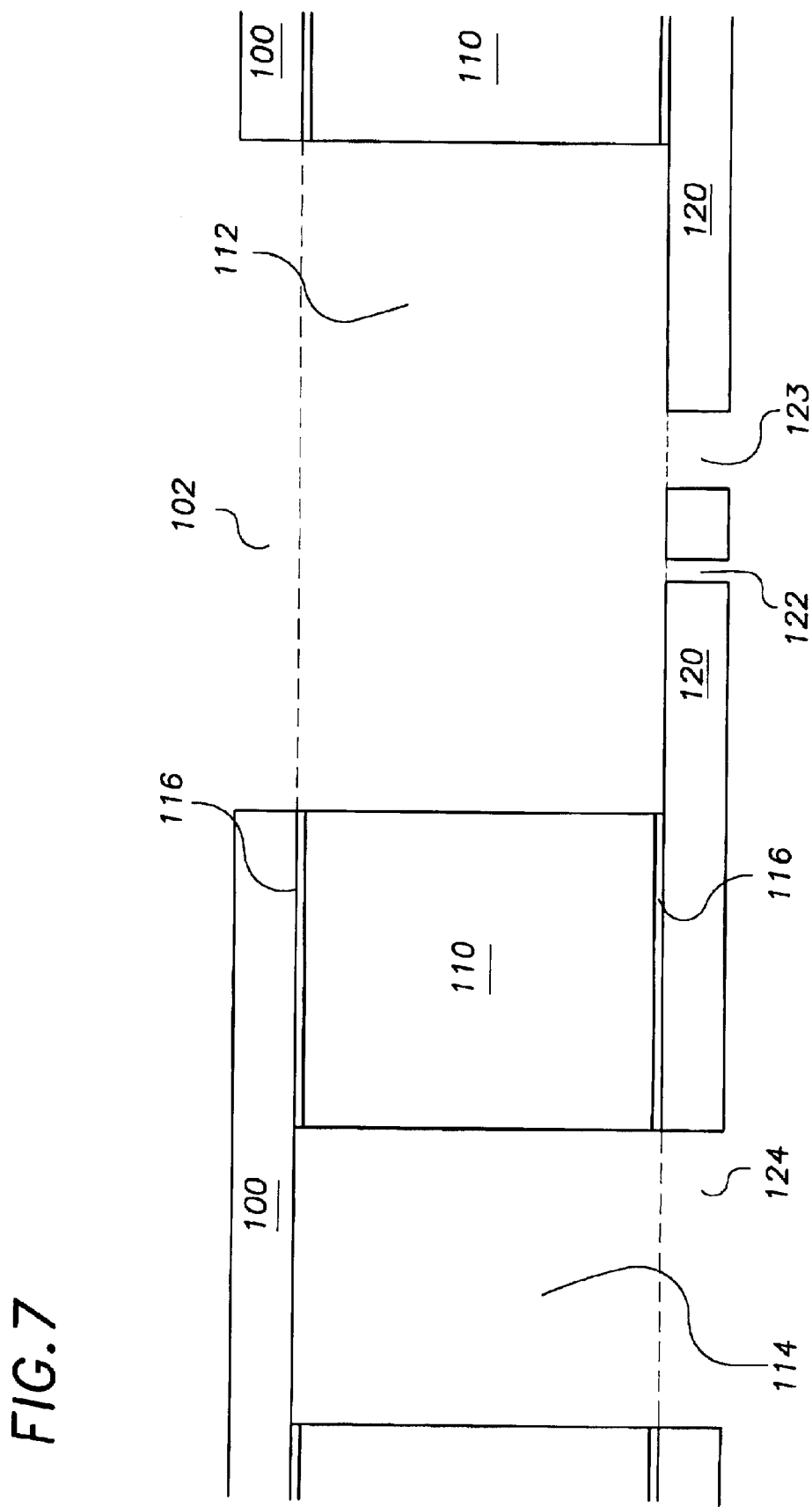
FIG. 7 is a cross-sectional view of the invention showing a three-layer stencil.

FIG. 7 is a cross-sectional view of the invention showing a three-layer stencil having a relief area and step-down pocket. The upper layer 100 features at least one step-down pocket 102 to allow solder paste or conductive adhesive to be deposited to the delivery apertures 122 and 123 of the lower contacting layer 120. The step-down pocket 102 is a reservoir-like opening in the stencil into which surface mount material is directly applied and in which a squeegee or other application mechanism operates. The upper layer 100 is manufactured typically with the chemical etch process although the laser-cut and electroforming processes could also be used. In one embodiment, the upper layer 100 has a typical thickness of 5 to 10 mils and is typically made of Alloy 42 material although other thicknesses and materials, such as stainless steel or electroformed nickel, are also possible.

The middle layer 110 features both at least one relief area 114, corresponding to the preexisting devices on the PCB, and at least one extended step-down pocket 112, corresponding to the step-down pocket 102 on the upper layer. The middle layer 110 is typically manufactured with the chemical etch process although laser-cut and electroforming processes are also possible. In one embodiment, the middle layer 110 has a thickness of 30 mils and is made of Alloy 42 material although other thicknesses and materials, such as stainless steel and electroformed nickel, are possible.

The lower layer 120 features at least one relief opening 124, which is connected to the relief area 114 in the middle layer 110 and corresponds to preexisting devices on the PCB, and SMT type delivery apertures 122 and 123 for printing solder paste or conductive adhesive to the PCB. Note that delivery aperture 123 is larger than aperture 122. A larger delivery aperture allows more glue to be delivered from the reservoir 112, providing more glue area and height for aperture 123 as compared to aperture 122. The lower layer 120 is typically manufactured by a laser-cut process although chemical etch and electroforming processes are also possible. The lower layer 120 has a nominal thickness of 5 to 10 mils and is made of Alloy 42 material although other thicknesses and materials, such as stainless steel and electroformed nickel, are possible.

The three layers are produced with unevenly spaced etched registration pin holes along the glue borders. A 3 mil laminate layer 116 of dry-film solder mask is applied cold to both sides of the middle layer. The layers are assembled using registration pins and etched registration holes.

The sandwiched board of layers is fed through a hot-roll laminator to pressure- and heat-activate the adhesive quality of the solder mask. The treated board is then fed through a developer to remove excess mask and form contiguous sidewalls between the layers. The treated and developed board is heat-cured at 300 degrees Fahrenheit.

Figure 8:
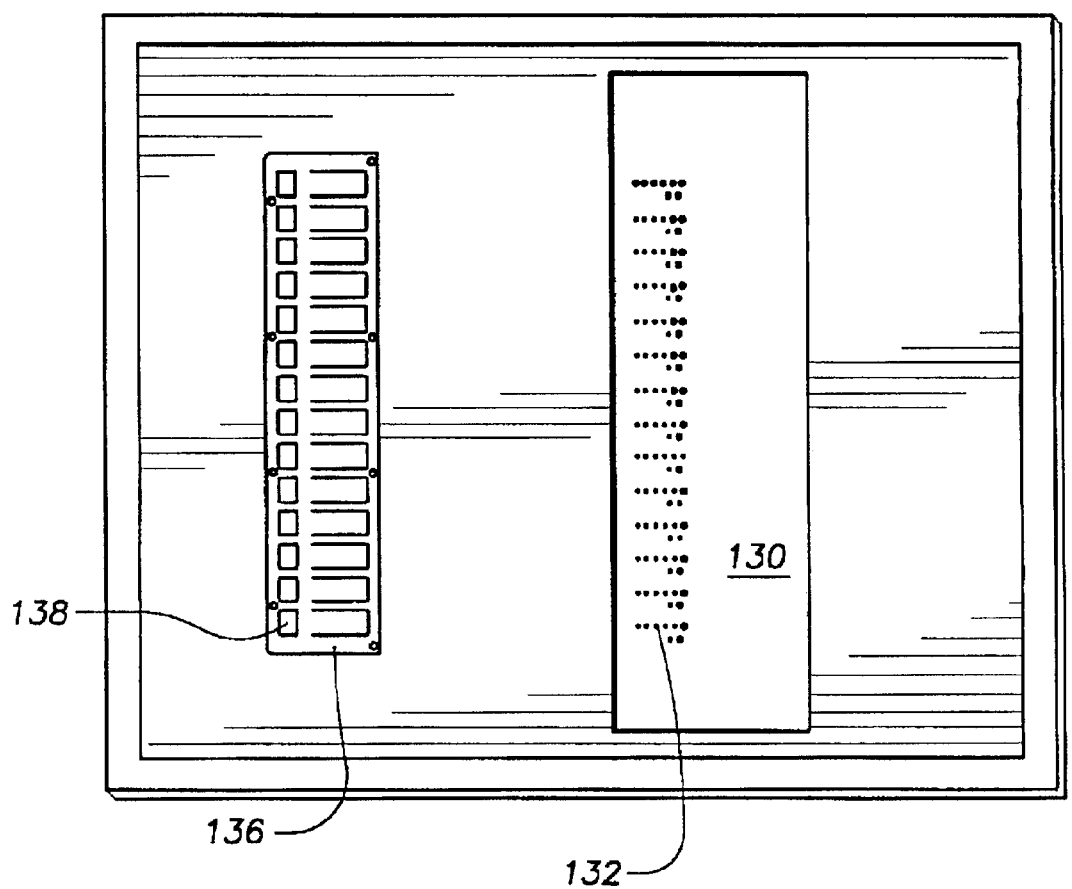
FIG. 8 is a plan view of the stencil (material application side) showing a step-down pocket and delivery apertures and a sample flexible circuit with heat sinks.
Figure 9:
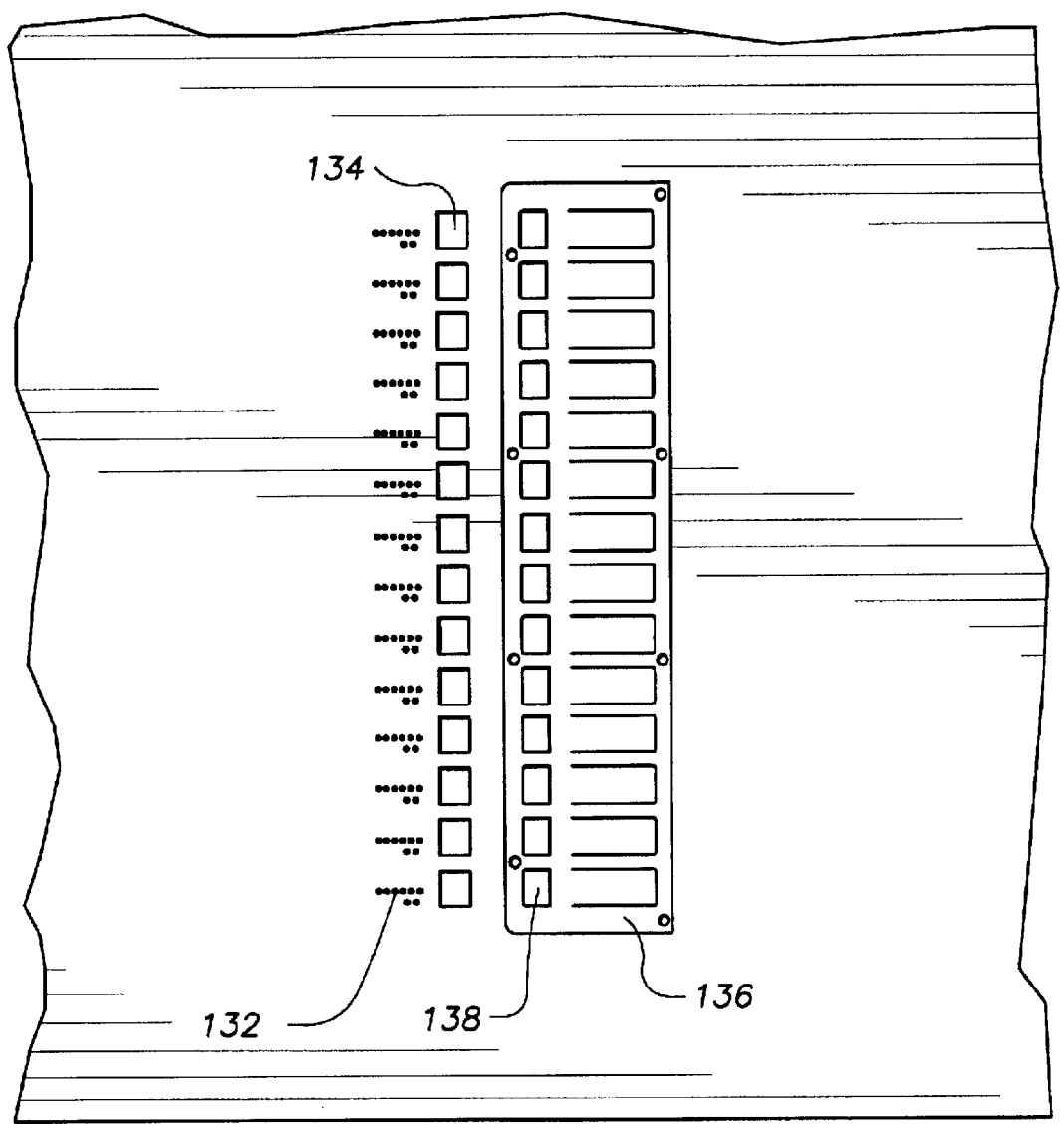
FIG. 9 is a plan view of the stencil (delivery aperture side) showing delivery apertures and relief areas and a sample flexible circuit with heat sinks.

FIG. 8 is a plan view of the stencil (material application side) showing a step-down pocket 130 and delivery apertures 132 and a sample flexible circuit 136 with heat sinks 138. In one embodiment, the heat sinks 138 measure 25 mils high. The step-down pocket 130, which extends through the upper and middle layers, is seen on the right. Delivery apertures 132 can be seen at the bottom of the step-down pocket. FIG. 9 is a plan view of the stencil (delivery aperture side) showing delivery apertures 132 and relief areas 134 and the sample flexible circuit 136 with heat sinks 138. In the printing operation the stencil is positioned so that the heat sinks 138 on the flexible circuit 136 sit in the relief areas 134 allowing the flexible circuit 136 to gasket tightly to the stencil. Surface mount material is applied directly into the reservoir-like area of the step-down pocket 132 and a squeegee or other application mechanism is positioned and operated within the step-down pocket 132 to force material through the delivery apertures 134 and onto the flexible circuit 136 or other surface. This process allows for the finely controlled application of surface mount material to a specific location.

Figure 10:
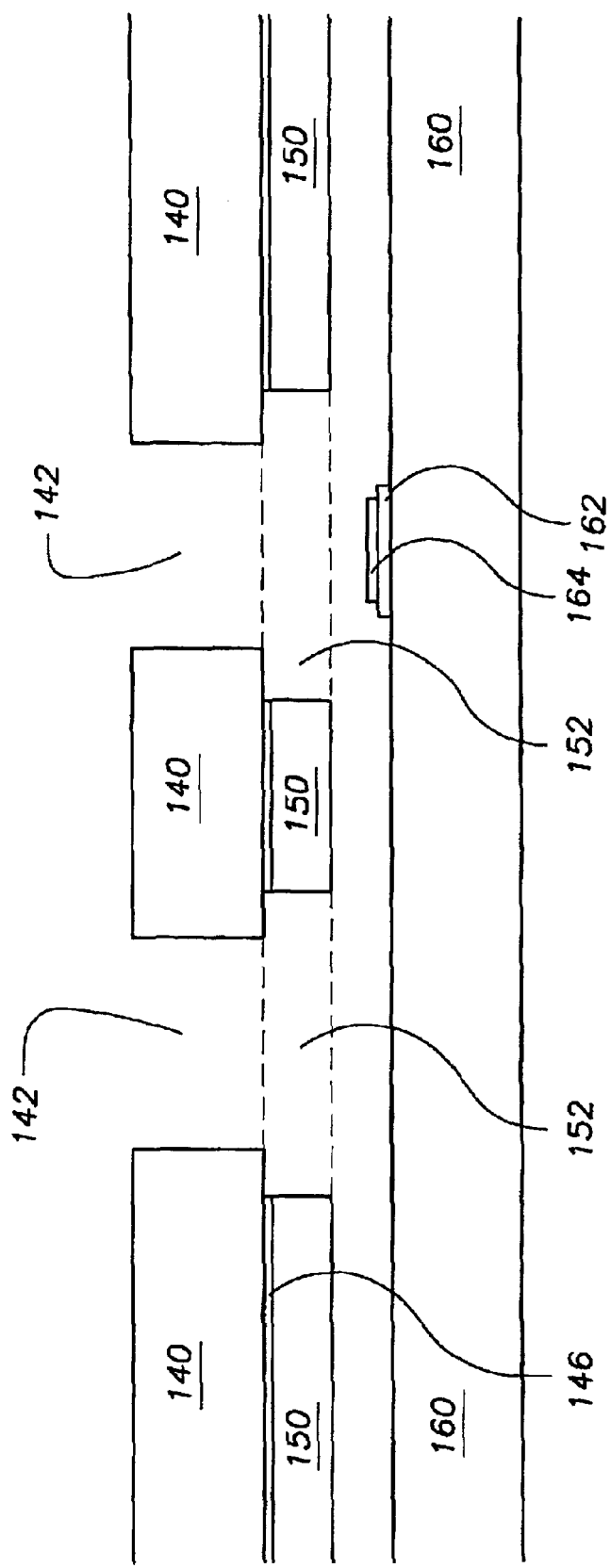
FIG. 10 is a cross-sectional view of a two layer stencil for delivering solder balls.

FIG. 10 is a cross-sectional view of a two layer stencil for delivering solder balls to a substrate. The upper layer 140 has ball drop reservoir apertures 142 and the bottom layer 150 has larger relief delivery apertures 152. The ball drop reservoir apertures 142 are formed in the upper layer 140 by either chemical etch, laser cut or electroforming processes. The lower layer 150 is created completely independently from the upper layer and can be formed by either chemical etch, laser cut or electroforming processes. Also shown is a substrate 160 with a pad 162 and flux 164 on the pad. In a preferred embodiment, the substrate 160 may be a BGA package or an entire silicon wafer with active circuits. A dry-mount aqueous solder mask is used to form an adhesive laminate 146 between the upper and lower layers and the two layers are aligned by means of registration pins and etched registration holes and laminated together. The solder mask provides a permanent adhesion between the layers, and once heat-cured, an impermeable solvent barrier at aperture openings. The bottom layer has an aperture size and layer thickness that provides clearance for the flux 164 on the pad 162 on the substrate 160 and provides apertures for dropping the solder balls onto the substrate.

In one embodiment, a 12 mil solder ball is dropped into a 14 mil long ball drop reservoir aperture 142 with an 18 mil long relief delivery aperture 152 in the lower layer 150. The upper layer 140 measures 8 mils in height, and the lower layer 150 measures 4 mils in height. The present invention allows for excellent control of the solder ball delivery through the use of the relief delivery aperture (both size and depth) as well as excellent control of the initial solder ball drop through the use of the ball drop reservoir aperture (both size and depth).

Figure 11:
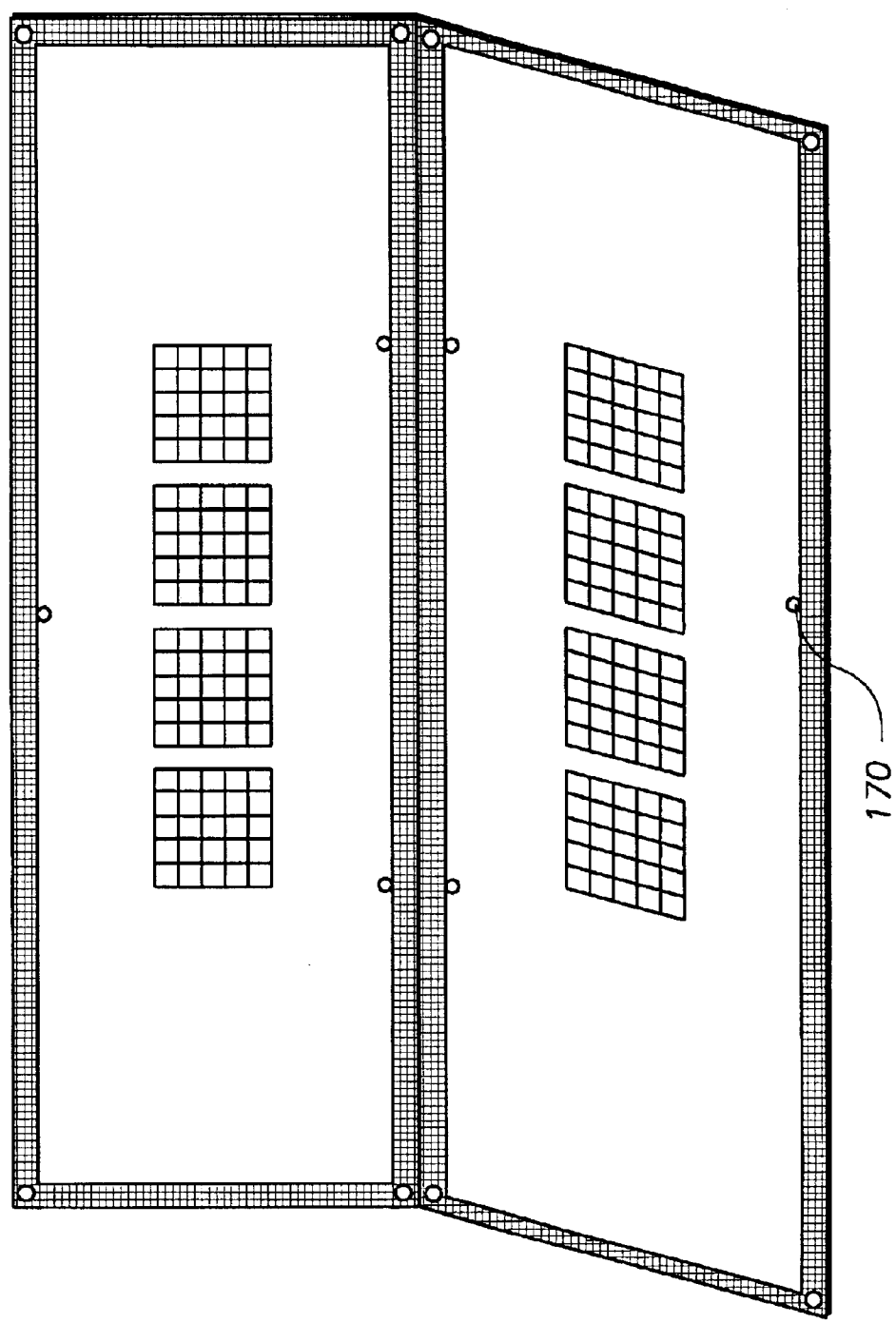
FIG. 11 shows two layers being prepared to be pinned together before laminating.
Figure 12:
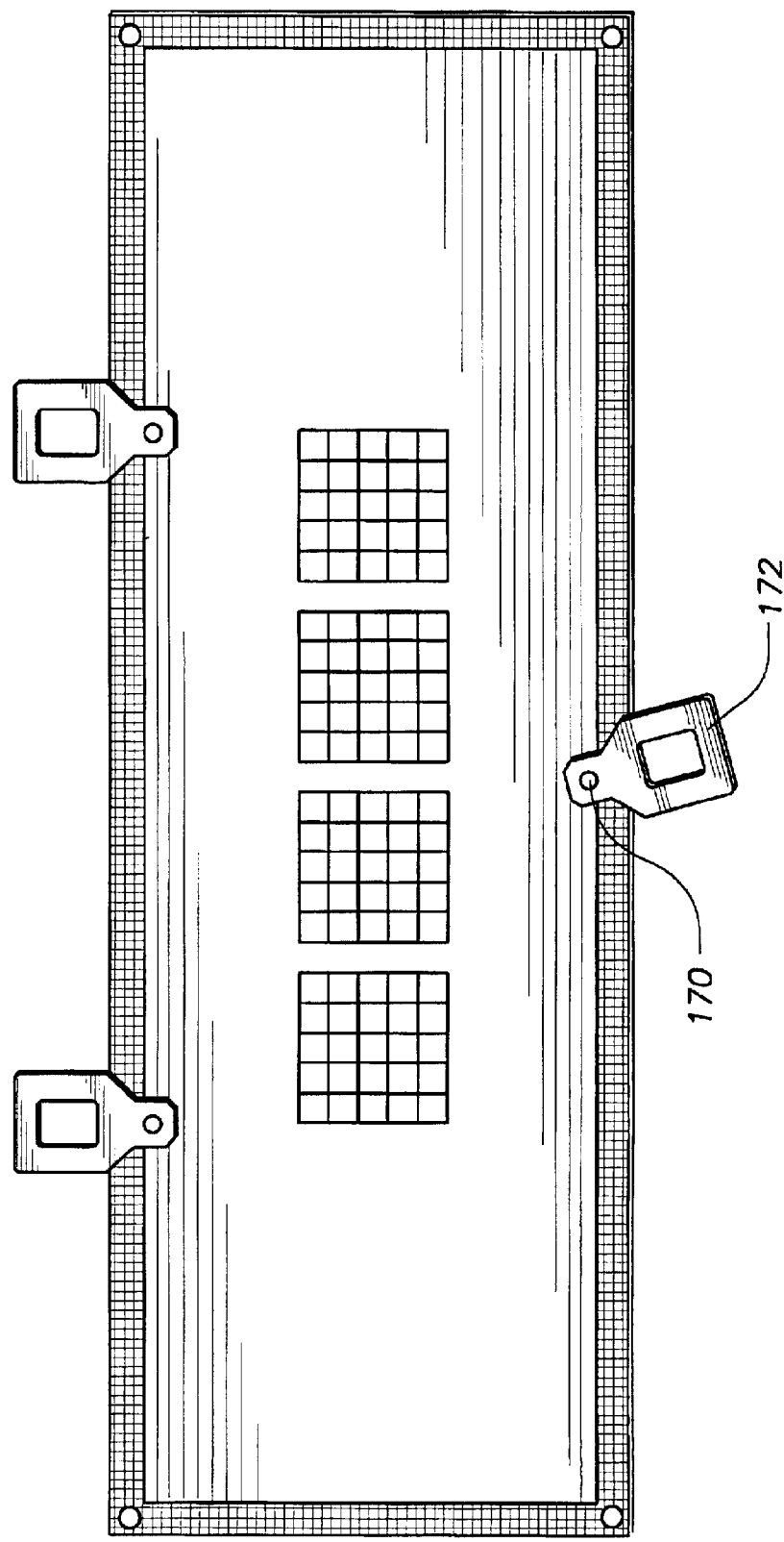
FIG. 12 shows the layer pins registered and ready for laminating.

FIG. 11 shows the two layers being prepared to be pinned together before the laminating process. FIG. 12 shows the layer pins registered and the layers ready for the laminating process. The registration pins 172 and holes 170 provide for proper alignment of the layers before they are attached together by the laminating process.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A stencil for applying surface mount materials, comprising:
   at least two layers, said at least two layers comprising:
   at least one reservoir pocket; and
   at least one delivery aperture, wherein said at least one delivery aperture is adapted to deliver surface mount materials from said at least one reservoir pocket to a surface;
   wherein said at least two layers are aligned by means of at least one registration pin and at least one registration hole.

2. The stencil of claim 1, wherein said at least two layers further comprise:
   at least one relief area, wherein said at least one relief area provides clearance for preexisting components on said surface so as to allow said at least one delivery aperture to contact said surface.

3. The stencil of claim 2 wherein said stencil comprises two layers,
   an upper layer having at least one reservoir pocket; and
   a lower layer having at least one delivery aperture and at least one relief area.

4. The stencil of claim 2 wherein said stencil comprises two layers:
   an upper layer having at least one reservoir pocket and at least one relief area; and
   a lower layer having at least one delivery aperture and at least one relief area,
   wherein the at least one relief area of the upper layer is connected to the at least one relief area of the lower layer.

5. The stencil of claim 2 wherein said stencil comprises three layers:
   an upper layer having at least one reservoir pocket;
   a middle layer having at least one relief area and at least one reservoir pocket; and
   a lower layer having at least one delivery aperture and at least one relief area,
   wherein the at least one reservoir pocket of the upper layer is connected to the at least one reservoir pocket of the middle layer, and the at least one relief area of the middle layer is connected to the at least one relief area of the lower layer.

6. The stencil of claim 1,
   wherein said at least one reservoir pocket and said at least one delivery aperture include contiguous and impermeable sidewalls at an adjoining interface.

7. The stencil of claim 6, wherein said contiguous and impermeable sidewalls include a solvent-resistant resin.

8. The stencil of claim 1, wherein said at least two layers are manufactured out of metal.

9. The stencil of claim 1, wherein said at least one delivery aperture is adapted to deliver surface mount materials selected from the group consisting of: adhesives, conducting adhesives, solder paste, and solder balls.

10. The stencil of claim 1, wherein said at least two layers are attached to one another by means of a dry-mount aqueous solder mask laminate.

11. The stencil of claim 1, wherein said stencil comprises two layers:
    an upper layer with at least one reservoir pocket; and
    a lower contacting layer with at least one delivery aperture, wherein said at least one delivery aperture delivers surface mount materials from said at least one reservoir pocket to said surface.

12. The stencil of claim 1, wherein said at least one reservoir pocket comprises:
    a step-down pocket, wherein said step-down pocket is adapted to receive surface mount material applied directly into said step-down pocket and is further adapted to receive a device for forcing said surface mount material through said at least one delivery aperture.

13. A stencil for applying surface mount materials, comprising:
    an upper reservoir layer with at least one reservoir pocket;
    a middle separation layer with at least one relief area, wherein said at least one relief area provides clearance for preexisting components mounted on a surface, and wherein said middle separation layer further comprises at least one reservoir through pocket connected to said at least one reservoir pocket in said upper layer; and
    a lower contacting layer with at least one delivery aperture, wherein said at least one delivery aperture is adapted to deliver measured surface mount materials from said at least one reservoir pocket by means of said at least one reservoir through pocket to said surface, and wherein said lower contacting layer further comprises at least one relief opening which is connected to said at least one relief area in said middle separation layer;
    wherein said upper layer, middle layer, and lower layer are aligned by means of at least one registration pin and at least one registration hole.

14. The stencil 13,
    wherein said at least one reservoir pocket and said at least one delivery aperture include contiguous and impermeable sidewalls at an adjoining interface.

15. The stencil of claim 14, wherein said contiguous and impermeable sidewalls include a solvent-resistant resin.

16. The stencil of claim 13, wherein said upper layer, middle layer and lower layer are manufactured out of metal.

17. The stencil of claim 13, wherein said at least one delivery aperture is adapted to deliver surface mount materials selected from the group consisting of: adhesives, conducting adhesives, solder paste, and solder balls.

18. The stencil of claim 13, wherein said upper layer, middle layer, and lower layer are attached to one another by means of a dry-mount aqueous solder mask laminate.

19. A stencil for applying solder balls in a desired pattern on a substrate, comprising:
    an upper layer with at least one ball drop reservoir aperture; and
    a lower contacting layer with at least one relief delivery aperture, wherein said relief delivery aperture is adapted to draw solder material from said at least one ball drop reservoir aperture and provides clearance for flux on pad sites on said substrate;
    wherein said upper layer and lower layer are aligned by means of at least one registration pin and at least one registration hole.

20. The stencil of claim 19,
    wherein said at least one ball drop reservoir aperture and said at least one relief delivery aperture include contiguous and impermeable sidewalls at an adjoining interface.

21. The stencil of claim 20, wherein said contiguous and impermeable sidewalls include a solvent-resistant resin.

22. The stencil of claim 19, wherein said upper layer and lower layer are manufactured out of metal.

23. The stencil of claim 19, wherein said upper layer and lower layer are attached to one another by means of a dry-mount aqueous solder mask laminate.

24. A method for depositing surface mount materials onto a surface, comprising:

matching relief areas in a stencil with preexisting surface mount components on a surface;

affixing the stencil to the surface;

applying surface mount materials to said stencil such that said surface mount materials fill reservoir pockets in said stencil;

depositing surface mount materials onto said surface through delivery apertures on said stencil, said delivery apertures drawing said surface mount material from said reservoir pockets; and aligning at least an upper layer and a lower layer of said stencil using at least one registration pin and at least one registration hole.

25. The method of claim 24, wherein said reservoir pockets and said delivery apertures include contiguous and impermeable sidewalls at adjoining interfaces.

26. The method of claim 25, wherein said contiguous and impermeable sidewalls include a solvent-resistant resin.

27. The method of claim 24, wherein said surface mount materials are selected from the group consisting of: adhesives, conducting adhesives, solder paste, and solder balls.

28. The method of claim 24, wherein said surface is selected from the group consisting of: a printed circuit board, a flexible circuit, and a wafer.

* * * * *